United States Patent
Ohba et al.

[11] Patent Number: 5,370,779
[45] Date of Patent: Dec. 6, 1994

[54] ECR PLASMA PROCESS

[75] Inventors: Kazuo Ohba, 2-3, Matsubacho 4-chome, Higashimatsuyama-shi, Saitama; Yoshinori Shima, 768-15, Ohzenji, Asaqu-ku, Kawasaki-shi; Akira Ohba, 12-89, Miyado 3-chome, Asaka-shi, Saitama, all of Japan

[73] Assignees: Sakae Electronics Industrial Co., Ltd.; Kazuo Ohba, both of Saitama; Yoshinori Shima, Kanagawa; Akira Ohba, Saitama, all of Japan

[21] Appl. No.: 126,790

[22] Filed: Sep. 24, 1993

[30] Foreign Application Priority Data

Oct. 9, 1992 [JP]  Japan .................... 4-272046

[51] Int. Cl.⁵ .............. C23C 14/00; C23C 14/24; C23F 1/00
[52] U.S. Cl. .................. 204/192.34; 156/643; 427/571
[58] Field of Search .......... 204/298.36, 298, 37, 204/298.38, 192.32, 192.34; 118/723 MA, 723 ME, 723 MR, 723 MW; 156/345, 643; 427/562, 563, 564, 571, 575; 315/111.21, 111.31, 111.41, 111.51

[56] References Cited

U.S. PATENT DOCUMENTS 4,757,237  7/1988  Hellbolm et al. ............ 315/111.21
5,087,857  2/1992  Ahn ............................ 118/723 MR
5,208,512  5/1993  Forster et al. ............... 204/298.37

FOREIGN PATENT DOCUMENTS 3729347  3/1988  Germany .

OTHER PUBLICATIONS

Derwent Abstract of WO-8904217 dated May 18, 1989 (2 pages).
Patent Abstracts of Japan, vol. 17, No. 292 (E-1376) 4 Jun. 1993 & JP-A-50 21 392 (Fuji Electric Co. Ltd.) 29 Jan. 1993.
Patent Abstracts of Japan, vol. 13, No. 578 (E-864) 20 Dec. 1989 & JP-A-12 43 359 (Matsushita Electric Ind. Co. Ltd.).

Primary Examiner—R. Bruce Breneman
Assistant Examiner—Rodney McDonald
Attorney, Agent, or Firm—Flynn, Thiel, Boutell & Tanis

[57] ABSTRACT

A plasma process utilizing an electron cyclotron resonance (ECR) phenomenon caused by generating a magnetic field either parallel or perpendicular to, or both parallel and perpendicular to, a microwave propagation direction, characterized in that an ion beam is made to converge by applying a pulse voltage to a rotating magnetic field, a pulse voltage is applied to deflection plates, and an accelerating pulse voltage is further applied to a plasma.

2 Claims, 2 Drawing Sheets

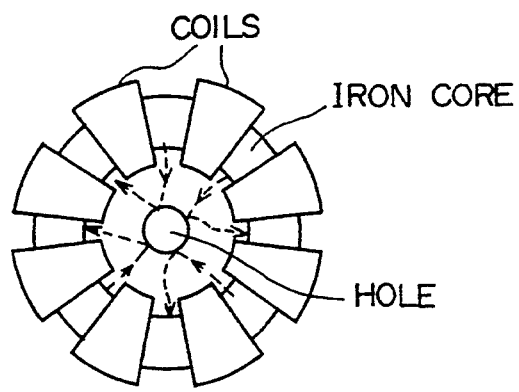
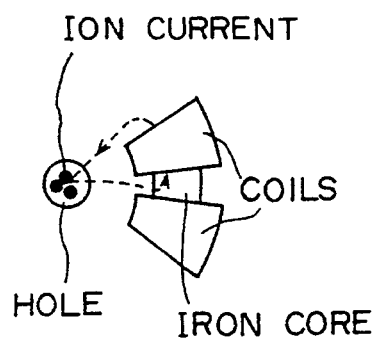
FIG.2(a)  FIG.2(b)
FIG.3
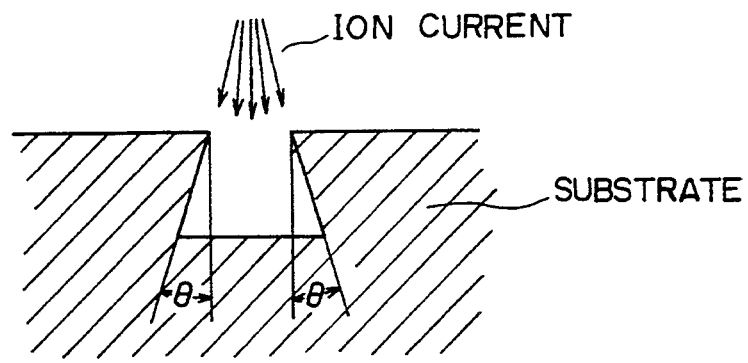

ECR PLASMA PROCESS

BACKGROUND OF THE INVENTION

1. Field of the Invention

This invention relates to a high precision ECR plasma process for etching and coating.

2. Description of the Prior Art

The conventional ECR plasma process employs electron cyclotron resonance due to a constant magnetic field of 0.0875 T in the plasma state that can be used for etching and coating.

In the conventional ECR plasma process which uses a constant magnetic field, a rapid ion rotation current is set up so that the ions scatter. The $\theta$ offset angle of an ion beam in a substrate therefore increases as shown in FIG. 3 so that anisotropic patterning becomes difficult. Further, as a result of continuous irradiation, hollow cavities are formed by vapor and the substrate is heated over a large part of its area so that it is difficult to achieve high patterning precision.

SUMMARY OF THE INVENTION

With the above in view, the present invention was made to overcome the above and other problems encountered in the prior art.

Accordingly, it is an object of the present invention to provide an ECR plasma process which can pattern substrates with high precision.

To the above and other ends, the invention provides a plasma process utilizing an electron cyclotron resonance (ECR) phenomenon caused by generating a magnetic field either parallel or perpendicular to, or both parallel and perpendicular to, a microwave propagation direction, characterized in that an ion beam is made to converge by applying a pulse voltage to a rotating magnetic field, a pulse voltage is applied to deflection plates, and an accelerating pulse voltage is further applied to a plasma.

BRIEF DESCRIPTION OF THE DRAWINGS

FIG. 2 shows a transverse section of a rotating magnetic field generator such as is used in this invention.

FIG. 3 is a schematic view of plasma processing of a substrate showing the offset angle.

DETAILED DESCRIPTION OF THE PREFERRED EMBODIMENTS

Figure 1:
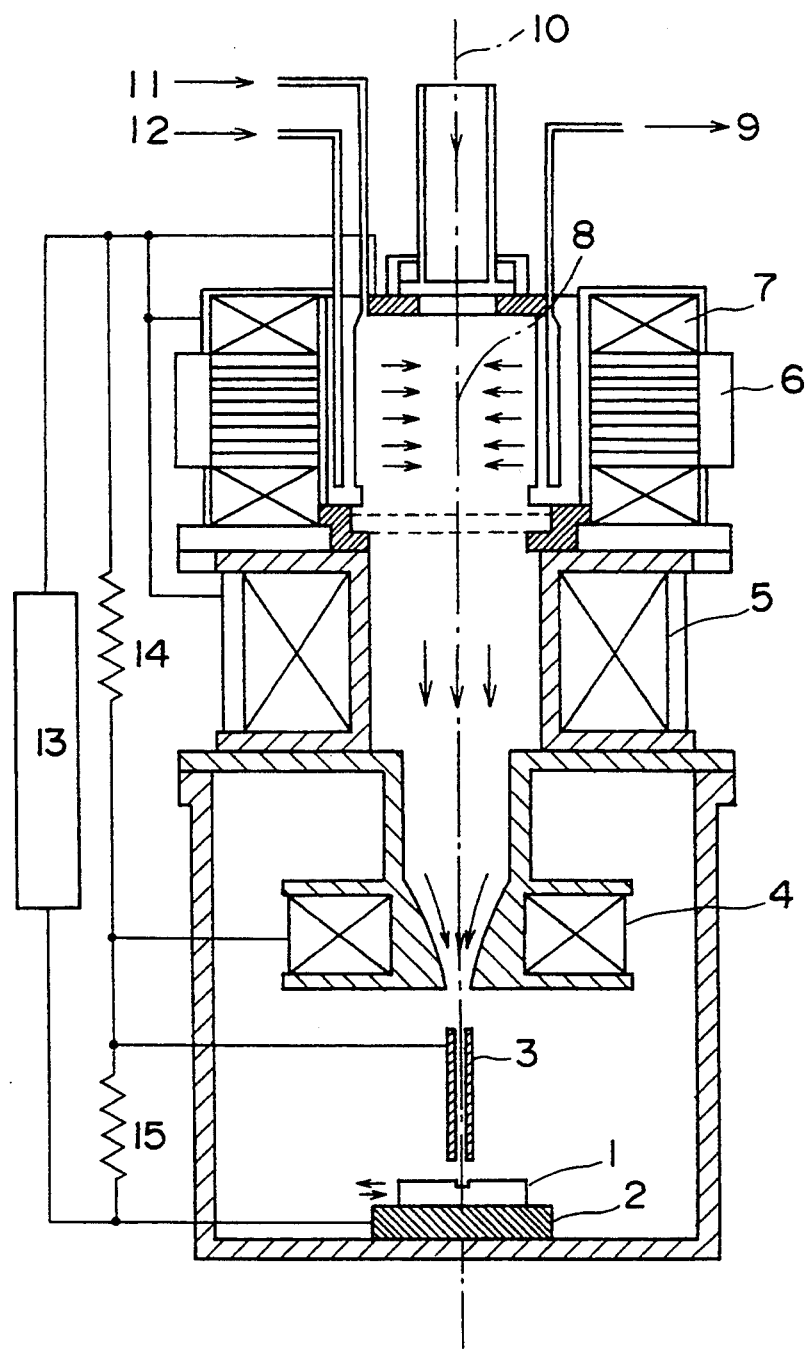
FIG. 1 shows a view on section of a plasma processing apparatus according to one embodiment of this invention.

This invention provides a plasma process utilizing an electron cyclotron resonance (ECR) phenomenon caused by generating a magnetic field either parallel or perpendicular to, or both parallel and perpendicular to, a microwave propagation direction, wherein an ion beam is made to converge by applying a pulse voltage to a rotating magnetic field, a pulse voltage is applied to deflection plates, and an accelerating pulse voltage is further applied to a plasma. A pulse voltage may also be applied to the magnetic field, which is generated either parallel or perpendicular to, or both parallel and perpendicular to, the microwave propagation direction. It is also preferable that the pulse voltage applied to the rotating magnetic field is applied at a pulse width lying in the range 0.01–500 ms. By applying a pulse voltage between an anode in the plasma and the substrate a cathode, and by applying a pulse voltage to the magnetic field generated either parallel or perpendicular to, or both parallel and perpendicular to, the microwave propagation direction, a steep temperature gradient is set up in the substrate so that the substrate can be patterned with high precision.

The aforesaid rotating magnetic field is generated by winding coils separately on an iron core, and applying a pulse voltage to the terminals of each coil, as shown in FIG. 2. In the case of FIG. 2, a pulse current is made to flow simultaneously in four alternate coils, and then flows in a remaining four coils. The ion beam is thereby made to converge, according to Fleming's Left Hand Rule, to the center of a hole through which the ion beam flows. This decreases ion scattering so that the substrate can be patterned with higher precision.

The deflection plates further accelerate the ion beam from the center of a converging electromagnetic lens toward the substrate surface, thereby permitting more rapid etching. This also permits more rapid coating, and by further increasing the convergence of the ion beam, enhances patterning precision.

The invention will be more clearly understood with reference to the following examples based on the drawings.

In FIG. 1, reference numeral 1 denotes a substrate, and 2 is a substrate table which also serves as a cathode. Numeral 3 denotes deflection plate electrodes, and 4 is a rotating magnetic field generator for causing an ion beam to converge. 5 denotes coils for generating a magnetic field parallel to a microwave propagation direction, 6 are yokes, 7 are coils for generating a constant magnetic field perpendicular to the microwave propagation direction at an ion source, 8 is the ion source, 9 is a cooling water outlet, and 10 shows the propagation direction of 2.45 GHz microwaves. Numeral 11 is a reactive gas inlet, and 12 is a cooling water inlet. Numeral 13 is a pulse generator, and 14 and 15 are resistors. A pulse voltage may thereby be applied as desired to the coils 5, 7, the rotating magnetic field generator 4, and the deflection plate electrodes 3.

Specific examples of patterning substrates will now be described.

EXAMPLE 1

The substrate 1 consisted of $SiO_2$. An etching gas consisting $CF_4 + 20\%$ $H_2$ was introduced via the reactive gas inlet 11, and the pressure adjusted to 0.05 Torr. A constant voltage was applied to the coils 5 so as to generate a magnetic field of average intensity 0.0875 T parallel to the microwave propagation direction. Further, a pulse voltage was applied to the rotating magnetic field generator 4, to the deflection plates 3 and between an anode in the plasma and the substrate a cathode, and the substrate was patterned. As shown in FIG. 1, a maximum etching rate of 0.33 $\mu$/min was obtained, i.e. more than 6 times higher than the etching rate according to the prior art, and the corresponding offset angle was 0.9°, which gave a much higher patterning precision than the angle of 13° according to the prior art.

TABLE 1

| Accelerating voltage waveform Pulse voltage, pulse width $\tau_{on}$ (ms) | Deflection plate pulse $\tau_{on}$ (ms) | Converging pulse $\tau_{on}$ (ms) | Magnetic flux density (T) Parallel magnetic field 0.0875 Magnetic flux density Parallel, constant magnetic field | Etching rate ($\mu$m/min) 0.05 Etching rate ($\mu$m/min) | Offset angle $\theta$ (°) 13.0 Offset angle $\theta$ (°) |
|---|---|---|---|---|---|
| 0.0001 | 0.0001 | 0.0001 | 0.0875 | 0.33 | 0.9 |
| 0.0005 | 0.0005 | 0.0005 | 0.0875 | 0.28 | 1.2 |
| 0.001 | 0.001 | 0.001 | 0.0875 | 0.26 | 1.3 |
| 0.003 | 0.003 | 0.003 | 0.0875 | 0.24 | 1.5 |
| 0.01 | 0.01 | 0.01 | 0.0875 | 0.21 | 1.9 |
| 0.03 | 0.03 | 0.03 | 0.0875 | 0.19 | 2.2 |
| 0.1 | 0.1 | 0.1 | 0.0875 | 0.17 | 2.6 |
| 0.2 | 0.2 | 0.2 | 0.0875 | 0.16 | 2.9 |
| 1.0 | 1.0 | 1.0 | 0.0875 | 0.14 | 3.8 |
| 3.0 | 3.0 | 3.0 | 0.0875 | 0.13 | 4.5 |
| 5.0 | 5.0 | 5.0 | 0.0875 | 0.12 | 1.8 |
| 20 | 20 | 20 | 0.0875 | 0.11 | 6.0 |
| 300 | 300 | 300 | 0.0875 | 0.09 | 8.8 |
| 700 | 700 | 700 | 0.0875 | 0.08 | 10.3 |

*Prior art

EXAMPLE 2

The same conditions as those of Example 1 were used, with the exception that an average magnetic field of 0.0875 T was applied perpendicular instead of parallel to the microwave propagation direction. As a result, as shown in Table 2, the maximum etching rate was a little lower than if the field were applied parallel to the microwave propagation direction. This is due to the fact that the ion velocity is a little lower in the perpendicular direction, but as there is less ion scattering, the corresponding offset angle was 0.7° which is highly satisfactory from the viewpoint of patterning precision.

TABLE 2

| Accelerating voltage waveform Pulse voltage, pulse width $\tau_{on}$ (ms) | Deflection plate pulse $\tau_{on}$ (ms) | Converging pulse $\tau_{on}$ (ms) | Magnetic flux density (T) Parallel magnetic field 0.0875 Magnetic flux density Parallel, constant magnetic field | Etching rate ($\mu$m/min) 0.05 Etching rate ($\mu$m/min) | Offset angle $\theta$ (°) 13.0 Offset angle $\theta$ (°) |
|---|---|---|---|---|---|
| 0.0001 | 0.0001 | 0.0001 | 0.0875 | 0.028 | 0.7 |
| 0.0005 | 0.0005 | 0.0005 | 0.0875 | 0.025 | 0.9 |
| 0.01 | 0.01 | 0.01 | 0.0875 | 0.19 | 1.5 |
| 0.02 | 0.02 | 0.02 | 0.0875 | 0.18 | 1.7 |
| 0.2 | 0.2 | 0.2 | 0.0875 | 0.14 | 2.5 |
| 1.0 | 1.0 | 1.0 | 0.0875 | 0.13 | 3.5 |
| 5.0 | 5.0 | 5.0 | 0.0875 | 0.12 | 4.7 |
| 30 | 30 | 30 | 0.0875 | 0.10 | 6.6 |
| 700 | 700 | 700 | 0.0875 | 0.07 | 9.6 |

*Prior art

EXAMPLE 3

The same conditions as those of Example 1 were used, with the exception that a voltage was applied to the coils 5 so as to apply an average magnetic field of 0.0875 T parallel to the microwave propagation direction, and a voltage was applied to the coils 7 so as to apply an average magnetic field of 0.0875 T perpendicular to the microwave propagation direction, this latter field being a shut-in magnetic field to increase ion density and lower ion temperature. A pulse voltage was further applied to the rotating magnetic field generator 4 in order to converge the ion beam, to the deflection plates 3, and between an anode in the plasma and the substrate as a cathode so as to set up a steep temperature gradient in the substrate 1.

As a result, high speed etching could be performed at a maximum rate of 0.45 $\mu$/min, i.e. 9 times the conventional rate, as shown in Table 3. An offset angle of 0.6° was obtained as compared with 13° in the prior art, and patterning precision was therefore extremely good.

TABLE 3

| * | | | | | |
|---|---|---|---|---|---|
| | | | Magnetic flux density (T) Parallel magnetic field 0.0875 | | |
| Accelerating voltage waveform Pulse voltage, pulse width $\tau_{on}$ (ms) | Deflection plate pulse $\tau_{on}$ (ms) | Converging pulse $\tau_{on}$ (ms) | Magnetic flux density Parallel, constant magnetic field | Etching rate ($\mu$m/min) 0.05 Etching rate ($\mu$m/min) | Offset angle $\theta$ (°) 13.0 Offset angle $\theta$ (°) |
| 0.0001 | 0.0001 | 0.0001 | 0.0875 | 0.45 | 0.6 |
| 0.005 | 0.005 | 0.005 | 0.0875 | 0.29 | 1.2 |
| 0.01 | 0.01 | 0.01 | 0.0875 | 0.27 | 1.3 |
| 0.02 | 0.02 | 0.02 | 0.0875 | 0.25 | 1.5 |
| 0.05 | 0.05 | 0.05 | 0.0875 | 0.23 | 1.8 |
| 0.10 | 0.10 | 0.10 | 0.0875 | 0.21 | 2.0 |
| 0.40 | 0.40 | 0.40 | 0.0875 | 0.18 | 2.6 |
| 1.0 | 1.0 | 1.0 | 0.0875 | 0.16 | 3.0 |
| 5 | 5 | 5 | 0.0875 | 0.14 | 4.1 |
| 10 | 10 | 10 | 0.0875 | 0.13 | 4.7 |
| 50 | 50 | 50 | 0.0875 | 0.11 | 6.3 |
| 500 | 500 | 500 | 0.0875 | 0.09 | 9.5 |
| 700 | 700 | 700 | 0.0875 | 0.08 | 10.0 |

*Prior art

EXAMPLE 4

Using Al$_2$O$_3$ as the plasma processing substrate, there was an intermittent ion irradiation effect. A small offset angle was obtained.

TABLE 4

| * | | | | | |
|---|---|---|---|---|---|
| | | | Magnetic flux density (T) Parrallel magnetic field 0.0875 | | |
| Accelerating voltage waveform Pulse voltage, pulse width $\tau_{on}$ (ms) | Deflection plate pulse $\tau_{on}$ (ms) | Rotating magnetic field pulse $\tau_{on}$ (ms) | Magnetic flux density Parallel, constant magnetic field | Etching rate ($\mu$m/min) 0.04 Etching rate ($\mu$m/min) | Offset angle $\theta$ (°) 14.0 Offset angle $\mu$ (°) |
| 0.0005 | 0.0005 | 0.0005 | 0.0875 | 0.32 | 0.73 |
| 0.005 | 0.005 | 0.005 | 0.0875 | 0.25 | 1.1 |
| 0.01 | 0.01 | 0.01 | 0.0875 | 0.23 | 1.3 |
| 0.05 | 0.05 | 0.05 | 0.0875 | 0.20 | 1.8 |
| 0.5 | 0.5 | 0.5 | 0.0875 | 0.15 | 2.7 |
| 5.0 | 5.0 | 5.0 | 0.0875 | 0.11 | 4.2 |
| 20 | 20 | 20 | 0.0875 | 0.10 | 5.2 |
| 500 | 500 | 500 | 0.0875 | 0.07 | 9.1 |

*Prior art

EXAMPLE 5

Using Si as the substrate, an Al thin film resistance coating test was performed. Al(C$_2$H$_5$)$_2$ gas was introduced in the test apparatus at a pressure of 1 Torr. A magnetic field of 0.0875 T was generated so as to produce an electron cyclotron resonance phenomenon, and an average magnetic field of 1.7 T was generated as the rotating magnetic field so as to coat the Si substrate with Al. Table 5 shows the results.

TABLE 5

| * | | | | | | |
|---|---|---|---|---|---|---|
| | | Magnetic flux density (T) Parallel magnetic field 0.0875 | | | | Non-uniformity of thickness |
| Accelerating voltage waveform Pulse voltage, pulse width $\tau_{on}$ (ms) | Deflection plate pulse $\tau_{on}$ (ms) | Rotating magnetic field pulse $\tau_{on}$ (ms) | Magnetic flux density Parallel, perpendicular, constant magnetic field | Coating rate ($\mu$m/min) 1.1 Coating rate ($\mu$m/min) | Surface roughness ($\mu$H max) 0.8 Surface roughness ($\mu$H max) | after 30 min ($\mu$m/mm$^2$) 0.19 Non-uniformity of thickness after 30 min ($\mu$m/mm$^2$) |
| 0.005 | 0.005 | 0.005 | 0.0875 | 4.0 | 0.075 | 0.027 |
| 0.01 | 0.01 | 0.01 | 0.0875 | 3.4 | 0.11 | 0.038 |
| 0.02 | 0.02 | 0.02 | 0.0875 | 2.9 | 0.15 | 0.05 |
| 0.05 | 0.05 | 0.05 | 0.0875 | 2.4 | 0.22 | 0.065 |
| 0.1 | 0.1 | 0.1 | 0.0875 | 2.1 | 0.28 | 0.076 |

*Prior art

Applying a pulse voltage of for example $V_p$=1000 V with a pulse width of $\tau_{on}$=0.005 ms, the coating rate was 4 $\mu$m/min, the surface roughness was 0.075 uHmax, and the non-uniformity of thickness was 0.027 $\mu$m/mm$^2$ which shows the coating was very uniform.

EXAMPLE 6

In the case of Example 5, using SiO$_2$ as the substrate, the pulse magnetic field was applied either parallel to (Table 6), perpendicular to (Table 7), or parallel and perpendicular to (Table 8), the microwave propagation direction. Tables 6, 7 and 8 show the test results when the average magnetic field was 0.0875 T.

TABLE 6*

| Accelerating voltage waveform Pulse voltage, pulse width $\tau_{on}$ (ms) | Converging pulse $\tau_{on}$ (ms) | Magnetic flux density (T) Parallel magnetic field 0.0875 0.0875T Parallel magnetic field average | Etching rate (μm/min) 0.05 Etching rate (μm/min) | Offset angle $\theta$ (°) 13.0 Offset angle $\theta$ (°) |
|---|---|---|---|---|
| 0.0001 | 0.0001 | 0.0875 | 0.44 | 0.6 |
| 0.0005 | 0.0005 | 0.0875 | 0.37 | 0.8 |
| 0.001 | 0.001 | 0.0875 | 0.35 | 0.9 |
| 0.005 | 0.005 | 0.0875 | 0.24 | 1.5 |
| 0.02 | 0.02 | 0.0875 | 0.25 | 1.5 |
| 0.05 | 0.05 | 0.0875 | 0.23 | 1.8 |
| 0.1 | 0.1 | 0.0875 | 0.21 | 2.0 |
| 0.5 | 0.5 | 0.0875 | 0.18 | 2.7 |
| 2.0 | 2.0 | 0.0875 | 0.15 | 3.4 |
| 5.0 | 5.0 | 0.0875 | 0.14 | 4.0 |
| 50 | 50 | 0.0875 | 0.11 | 6.0 |
| 500 | 500 | 0.0875 | 0.11 | 6.0 |
| 1000 | 1000 | 0.0875 | 0.08 | 10.0 |

*Prior art

TABLE 7*

| Accelerating voltage waveform Pulse voltage, pulse width $\tau_{on}$ (ms) | Converging pulse $\tau_{on}$ (ms) | Magnetic flux density (T) magnetic field 0.0875 Magnetic flux density 0.0875T Converging pulse magnetic field average | Etching rate (μm/min) 0.05 Etching rate (μm/min) | Offset angle $\theta$ (°) 13.0 Offset angle $\theta$ (°) |
|---|---|---|---|---|
| 0.0001 | 0.0001 | 0.0875 | 0.37 | 0.6 |
| 0.001 | 0.001 | 0.0875 | 0.30 | 0.8 |
| 0.01 | 0.01 | 0.0875 | 0.24 | 1.3 |
| 0.02 | 0.02 | 0.0875 | 0.22 | 1.5 |
| 0.2 | 0.2 | 0.0875 | 0.18 | 2.0 |
| 1.0 | 1.0 | 0.0875 | 0.16 | 3.4 |
| 5.0 | 5.0 | 0.0875 | 0.14 | 4.3 |
| 30 | 30 | 0.0875 | 0.11 | 6.3 |
| 700 | 700 | 0.0875 | 0.08 | 9.1 |

*Prior art

TABLE 8*

| Accelerating voltage waveform Pulse voltage, pulse width $\tau_{on}$ (ms) | Deflection plate pulse $\tau_{on}$ (ms) | Rotating magnetic field pulse $\tau_{on}$ (ms) | Magnetic flux density (T) Parallel magnetic field 0.0875 Parallel magnetic field average | Magnetic flux density 0.0875T Perpendicular magnetic field average | Etching rate (μm/min) 0.05 Etching rate (μm/min) | Offset angle $\theta$ (°) 13.0 Offset angle $\theta$ (°) |
|---|---|---|---|---|---|---|
| 0.001 | 0.0001 | 0.0001 | 0.0875 | 0.0875 | 0.52 | 0.45 |
| 0.005 | 0.005 | 0.005 | 0.0875 | 0.0875 | 0.35 | 0.94 |
| 0.01 | 0.01 | 0.01 | 0.0875 | 0.0875 | 0.32 | 1.05 |
| 0.05 | 0.05 | 0.05 | 0.0875 | 0.0875 | 0.27 | 1.4 |
| 0.1 | 0.1 | 0.1 | 0.0875 | 0.0875 | 0.25 | 1.6 |
| 0.3 | 0.3 | 0.3 | 0.0875 | 0.0875 | 0.22 | 2.0 |
| 1.0 | 1.0 | 1.0 | 0.0875 | 0.0875 | 0.19 | 2.5 |
| 5 | 5 | 5 | 0.0875 | 0.0875 | 0.16 | 3.3 |
| 10 | 10 | 10 | 0.0875 | 0.0875 | 0.15 | 3.8 |
| 100 | 100 | 100 | 0.0875 | 0.0875 | 0.11 | 5.8 |
| 500 | 500 | 500 | 0.0875 | 0.0875 | 0.095 | 7.8 |
| 700 | 700 | 700 | 0.0875 | 0.0875 | 0.09 | 8.2 |

*Prior art

EXAMPLE 7

When Al$_2$O$_3$ was used as the substrate under the treatment conditions of Table 8, the etching rate was almost 10 times that of the prior art and the offset angle was extremely satisfactory, as shown in Table 9.

TABLE 9

| | | | Magnetic flux density (T) Parallel magnetic field 0.0875 | | | |
|---|---|---|---|---|---|---|
| Accelerating voltage waveform Pulse voltage, pulse width $\tau_{on}$ (ms) | Deflection plate pulse $\tau_{on}$ (ms) | Rotating magnetic field pulse $\tau_{on}$ (ms) | Magnetic flux density 0.0875T | | Etching rate ($\mu$m/min) 0.04 Etching rate ($\mu$m/min) | Offset angle $\theta$ (°) 14.0 Offset angle $\theta$ (°) |
| | | | Parallel magnetic field average | Perpendicular magnetic field average | | |
| 0.0005 | 0.0005 | 0.0005 | 0.0875 | 0.0875 | 0.39 | 0.62 |
| 0.005 | 0.005 | 0.005 | 0.0875 | 0.0875 | 0.3 | 0.95 |
| 0.01 | 0.01 | 0.01 | 0.0875 | 0.0875 | 0.28 | 1.1 |
| 0.02 | 0.02 | 0.02 | 0.0875 | 0.0875 | 0.26 | 1.2 |
| 0.05 | 0.05 | 0.05 | 0.0875 | 0.0875 | 0.24 | 1.5 |
| 0.2 | 0.2 | 0.2 | 0.0875 | 0.0875 | 0.20 | 1.9 |
| 0.5 | 0.5 | 0.4 | 0.0875 | 0.0875 | 0.18 | 2.3 |
| 5.0 | 5.0 | 5.0 | 0.0875 | 0.0875 | 0.14 | 3.2 |
| 50 | 50 | 50 | 0.0875 | 0.0875 | 0.11 | 5.3 |
| 600 | 600 | 600 | 0.0875 | 0.0875 | 0.09 | 8.4 |

*Prior art

EXAMPLE 8

When Al was coated, introducing $Al(C_2H_5)_2$ gas, under the same conditions as those described above, the coating rate was 6.2 $\mu$m/min, while the surface roughness and non-uniformity of coating thickness were very low as shown in Table 10.

TABLE 10

| | | | Magnetic flux density (T) Parallel magnetic field 0.085 | | | | Non-uniformity of thickness after 30 min ($\mu$m/mm$^2$) 0.19 Non-uniformity of thickness after 30 min ($\mu$m/mm$^2$) |
|---|---|---|---|---|---|---|---|
| Accelerating voltage waveform Pulse voltage, pulse width $\tau_{on}$ (ms) | Deflection plate pulse $\tau_{on}$ (ms) | Rotating magnetic field pulse | Magnetic flux density 0.0875T | | Coating rate ($\mu$m/min) 1.1 Coating rate ($\mu$m/min) | Surface roughness $\theta$ (°) 0.8 Surface roughness $\theta$ (°) | |
| | | | Parallel magnetic field average | Perpendicular magnetic field average | | | |
| 0.003 | 0.003 | 0.03 | 0.0875 | 0.0875 | 6.2 | 0.046 | 0.018 |
| 0.01 | 0.01 | 0.01 | 0.0875 | 0.0875 | 4.4 | 0.092 | 0.033 |
| 0.02 | 0.02 | 0.02 | 0.0875 | 0.0875 | 3.6 | 0.13 | 0.044 |
| 0.05 | 0.05 | 0.05 | 0.0875 | 0.0875 | 3.0 | 0.19 | 0.06 |
| 0.1 | 0.1 | 0.1 | 0.0875 | 0.0875 | 2.6 | 0.25 | 0.072 |

*Prior art

As described above, according to this invention, a pulse current is caused to flow in a rotating magnetic field generator so as to generate a pulse magnetic field, a pulse voltage is applied to deflection plate electrodes, a high voltage pulse magnetic field is applied to a substrate as a cathode, and a pulse voltage may also be applied either parallel or perpendicular to a microwave propagation direction. It is thus possible to perform highly anisotropic etching and coating.

What is claimed is:

1. In a plasma process for etching or coating a substrate utilizing an electron cyclotron resonance phenomenon caused by generating a magnetic field either parallel or perpendicular to, or both parallel and perpendicular to, a microwave propagation direction, the improvement comprising: converging an ion beam by applying a pulse voltage to a rotating magnetic field generator surrounding said ion beam, deflection plates through which said ion beam passes and to the substrate as a cathode and an anode in the plasma to accelerate the ion beam, said pulse voltage applied to said substrate and said anode having a voltage waveform $\tau_{on}$ which varies in the range of from 0.1 $\mu$s to $1\times 10^3$ $\mu$s.

2. The plasma process as defined in claim 1, wherein a pulse voltage is applied to coils which generate the magnetic field either parallel or perpendicular to, or both parallel and perpendicular to, the microwave propagation direction.

* * * * *